(12) United States Patent
Bae et al.

(10) Patent No.: US 11,901,275 B2
(45) Date of Patent: *Feb. 13, 2024

(54) SEMICONDUCTOR DEVICE PACKAGE

(71) Applicant: Advanced Semiconductor Engineering Korea, Inc., Paju-Si (KR)

(72) Inventors: Soonheung Bae, Paju-Si (KR); Hyunjoung Kim, Paju-Si (KR)

(73) Assignee: ADVANCED SEMICONDUCTOR ENGINEERING KOREA, INC., Paju-si (KR)

( * ) Notice: Subject to any disclaimer, the term of this patent is extended or adjusted under 35 U.S.C. 154(b) by 135 days.

This patent is subject to a terminal disclaimer.

(21) Appl. No.: 17/201,929

(22) Filed: Mar. 15, 2021

(65) Prior Publication Data

US 2021/0202359 A1    Jul. 1, 2021

Related U.S. Application Data

(63) Continuation of application No. 16/118,231, filed on Aug. 30, 2018, now Pat. No. 10,950,529.

(51) Int. Cl.
| | |
|---|---|
| *H01L 23/00* | (2006.01) |
| *H01L 21/48* | (2006.01) |
| *H01L 23/498* | (2006.01) |
| *H01L 23/13* | (2006.01) |
| *H01L 23/31* | (2006.01) |
| *H01L 25/065* | (2023.01) |

(Continued)

(52) U.S. Cl.
CPC .... *H01L 23/49816* (2013.01); *H01L 21/4853* (2013.01); *H01L 21/565* (2013.01); *H01L 23/13* (2013.01); *H01L 23/3128* (2013.01); *H01L 23/5386* (2013.01); *H01L 23/5389* (2013.01); *H01L 25/0652* (2013.01); *H01L 25/0657* (2013.01); *H01L 2225/06517* (2013.01); *H01L 2225/06572* (2013.01); *H01L 2225/06586* (2013.01)

(58) Field of Classification Search
CPC .......... H01L 23/5389; H01L 23/49816; H01L 23/13; H01L 23/3128; H01L 25/0652
See application file for complete search history.

(56) References Cited

U.S. PATENT DOCUMENTS

| | | |
|---|---|---|
| 7,208,824 B2 | 4/2007 | Lee et al. |
| 8,841,168 B2 | 9/2014 | Schwarz et al. |
| 9,202,715 B2 | 12/2015 | Kim et al. |

(Continued)

OTHER PUBLICATIONS

Final Office Action for U.S. Appl. No. 16/118,231, dated Jul. 10, 2020, 11 pages.

(Continued)

*Primary Examiner* — Hoa B Trinh
(74) *Attorney, Agent, or Firm* — FOLEY & LARDNER LLP

(57) ABSTRACT

A semiconductor device package includes a substrate, a first insulation layer and an electrical contact. The first insulation layer is disposed on the first surface of the substrate. The electrical contact is disposed on the substrate and has a first portion surrounded by the first insulation layer and a second portion exposed from the first insulation layer, and a neck portion between the first portion and the second portion of the electrical contact. Further, the second portion tapers from the neck portion.

20 Claims, 14 Drawing Sheets

(51) Int. Cl.
*H01L 23/538* (2006.01)
*H01L 21/56* (2006.01)

(56) References Cited

U.S. PATENT DOCUMENTS

| | | |
|---|---|---|
| 9,397,074 B1 | 7/2016 | Lee et al. |
| 9,578,738 B2 | 2/2017 | Matsui et al. |
| 10,256,173 B2 | 4/2019 | Wu et al. |
| 10,950,529 B2 * | 3/2021 | Bae .................... H01L 23/3128 |
| 2012/0061855 A1 | 3/2012 | Do et al. |
| 2013/0181342 A1 | 7/2013 | Park |
| 2016/0218091 A1 * | 7/2016 | Du ....................... H01L 25/105 |
| 2017/0143813 A1 | 5/2017 | Pulido et al. |
| 2017/0243813 A1 * | 8/2017 | Wu .................... H01L 21/4853 |
| 2017/0294389 A1 * | 10/2017 | Factor ................. H01L 25/0657 |
| 2017/0309597 A1 * | 10/2017 | Chuang ................... H01L 24/97 |
| 2017/0338205 A1 * | 11/2017 | Sung ................ H01L 23/49816 |

OTHER PUBLICATIONS

Non-Final Office Action for U.S. Appl. No. 16/118,231, dated Dec. 31, 2019, 17 pages.
Notice of Allowance for U.S. Appl. No. 16/118,231, dated Nov. 16, 2020, 10 pages.

\* cited by examiner

SEMICONDUCTOR DEVICE PACKAGE

CROSS-REFERENCE TO RELATED APPLICATION

This application is a continuation of U.S. patent application Ser. No. 16/118,231 filed Aug. 30, 2018, the contents of which is incorporated herein by reference in its entirety.

BACKGROUND

1. Technical Field

The instant disclosure relates to a semiconductor device package, especially a double sided mold package.

2. Description of Related Art

In order to increase package density, a dual-side assembly is employed for semiconductor package technology. In general, the input/output (I/O) terminal of the package connected to an external board (e.g. PCB board) may include a solder ball, which is exposed from molding compound.

SUMMARY

According to one example embodiment of the instant disclosure, a semiconductor device package comprises a substrate, a first insulation layer and an electrical contact. The substrate has a first surface and a second surface opposite to the first surface. The first insulation layer has a first surface and a second surface opposite to the first surface and the first insulation layer is disposed on the first surface of the substrate. Further, the first insulation layer comprises a filler which has a surface coplanar with the first surface of the first insulation layer. The electrical contact is disposed on the first surface of the substrate, wherein the electrical contact has a first portion surrounded by the first insulation layer and a second portion exposed from the first insulation layer, and a neck portion between the first portion and the second portion of the electrical contact. Further, the second portion tapers from the neck portion.

According to another example embodiment of the instant disclosure, a semiconductor device package comprises a substrate, a first insulation layer, a first electrical contact and a second electrical contact. The substrate has a first surface and a second surface opposite to the first surface. The first insulation layer has a first surface and a second surface opposite to the first surface and the first insulation layer being disposed on the first surface of the substrate. Further, the first insulation layer comprises a filler which has a surface coplanar with the first surface of the first insulation layer. The first electrical contact is disposed on the first surface of the substrate, wherein the first electrical contact has a first portion surrounded by the first insulation layer, a second portion exposed from the first insulation layer, and a first neck portion between the first portion and the second portion of the first electrical contact. The second electrical contact is disposed on the first surface of the substrate, wherein the second electrical contact has a first portion surrounded by the first insulation layer and a second portion exposed from the first insulation layer, and a first neck portion between the first portion and the second portion of the second electrical contact. Further, the distance between the second portion of the first electrical contact and the second portion of the second electrical contact is larger than or equal to the distance between the first neck portion of the first electrical contact and the first neck portion of the second electrical contact.

According to another example embodiment of the instant disclosure, a method of manufacturing a semiconductor device package comprises: a) providing a substrate, b) providing an electrical contact on the substrate, c) providing a first insulation layer on the substrate, wherein the first insulation layer encapsulates the electrical contact, d) removing a portion of the first insulation layer and a portion of the electrical contact such that the electrical contact has an exposed surface exposed from the insulation layer; and e) printing a solder paste on the exposed surface of the electrical contact.

In order to further understand the instant disclosure, the following embodiments are provided along with illustrations to facilitate appreciation of the instant disclosure; however, the appended drawings are merely provided for reference and illustration, without any intention to limit the scope of the instant disclosure.

DETAILED DESCRIPTION

The aforementioned illustrations and following detailed descriptions are examples for the purpose of further explaining the scope of the instant disclosure. Other objectives and advantages related to the instant disclosure will be illustrated in the subsequent descriptions and appended drawings.

Figure 1A:
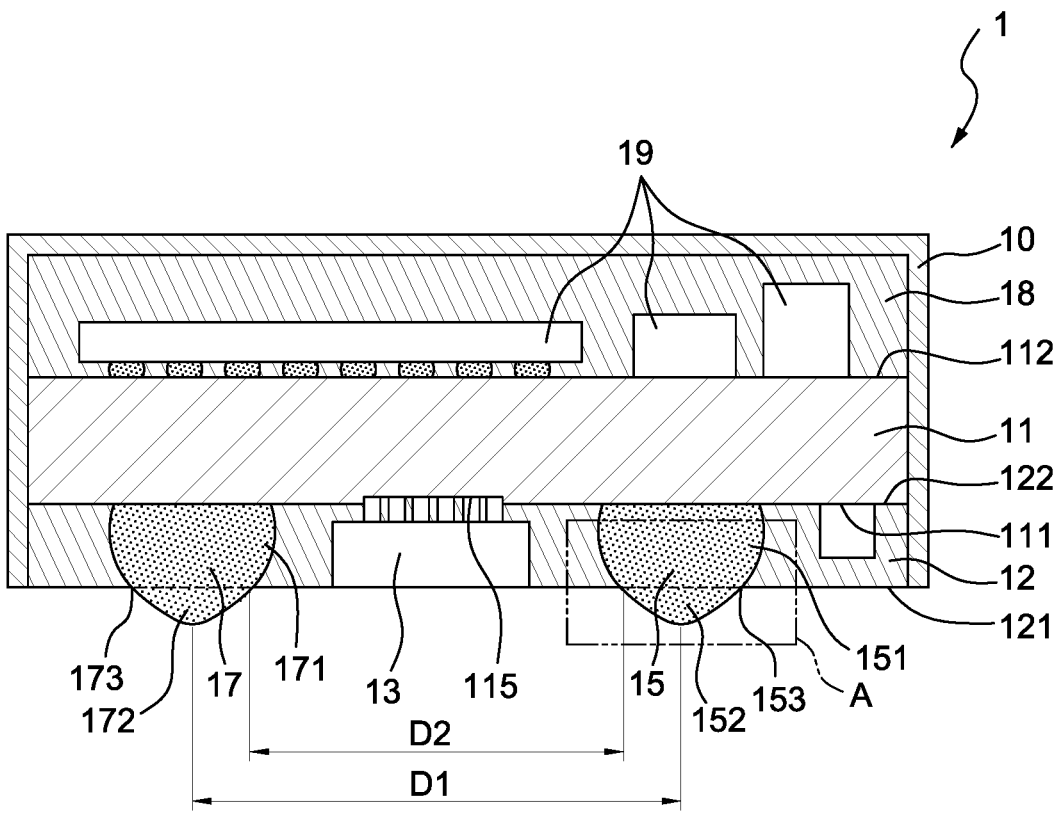
FIG. 1A is a cross-sectional view of a semiconductor device package in accordance with an embodiment of the instant disclosure.

FIG. 1A shows a semiconductor device package 1 in accordance with an embodiment of the instant disclosure. With reference to FIG. 1A, the semiconductor device package 1 of this embodiment includes a substrate 11. The substrate 11 has a lower surface 111 and an upper surface 112 opposite to the lower surface 111. An insulation layer 12 which comprises an encapsulation material is disposed on the first surface 111 of the substrate 11. The insulation layer 12 has a lower surface 121 and an upper surface 122 which is opposite to the lower surface 121 of the insulation layer 12 and substantially attached to the lower surface 111 of the substrate 11. At least one electronic component 13 is disposed on the lower surface 111 of the substrate 11 and surrounded or encapsulated by the insulation layer 11. Moreover, the lower surface 11 of the substrate 1 has a recess 115. The at least one electronic component 13 is disposed in the recess 115 and electrically connected to the substrate 11.

The semiconductor device package 1 further comprises electrical contacts 15, 17 which are used as external terminals to a motherboard. The electrical contact 15 is disposed on the lower surface 111 of the substrate 11, wherein the electrical contact 15 has a f portion 151 surrounded by the first insulation layer 12 and a portion 152 exposed from the first surface 121 of the first insulation layer 12. Furthermore, the lateral surface of the portion 151 of the electrical contact 15 is encapsulated by the insulation layer 12 and contacts the insulation layer 12 and the portion 152 of the electrical contact 15 is substantially disposed on the portion 151 of the first electrical contact 15. That is, the portion 152 of the electrical contact 15 protrudes from the elevation of the lower surface 121 of the first insulation layer 12. Likewise, the electrical contact 17 is disposed on the lower surface 111 of the substrate 11, wherein the electrical contact 17 has a portion 171 surrounded by the insulation layer 12 and a portion 172 exposed from the first surface 121 of the insulation layer 12. Furthermore, the lateral surface of the portion 171 of the electrical contact 17 is encapsulated by the insulation layer 12 and contacts the insulation layer 12, and the portion 172 of the electrical contact 17 is substantially disposed on the portion 171 of the electrical contact 17. That is, the portion 172 of the electrical contact 17 protrudes from the elevation of the lower surface 121 of the insulation layer 12.

Moreover, the semiconductor device package 1 comprises another insulation layer 18 disposed on the upper surface 112 of the substrate 11. One or more electronic components 19 are disposed on the upper surface 112 of the substrate 11 and substantially encapsulated by the insulation layer 18. In addition, a conductive layer 10 is disposed on the insulation layer 18 and substantially surrounds a lateral surface of the substrate 11 and a lateral surface of the insulation layer 12.

Figure 1B:
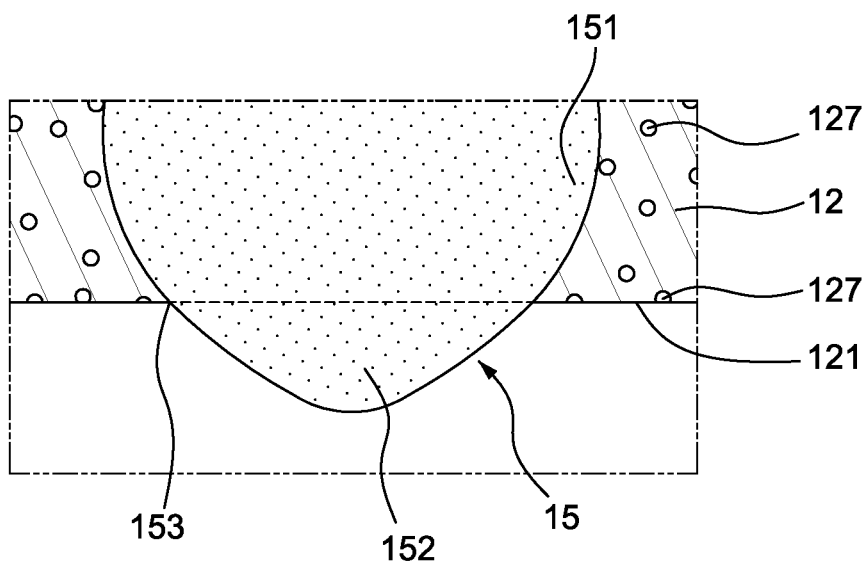
FIG. 1B is an enlarged view of portion "A" in FIG. 1A.

FIG. 1B is a partial enlarged view of portion "A" in FIG. 1A. With reference to FIG. 1B, the insulation layer 12 has a plurality of fillers 127, wherein at least one of the fillers 127 has a surface coplanar with the lower surface 121 of the insulation layer 12. Further, the electrical contact 15 has a neck portion between the portions 151 and 152 of the electrical contact 15, and the neck portion 153 and the lower surface 121 of the insulation layer 12 are substantially disposed at the same elevation. In addition, as shown in FIG. 1B, the portion 152 of the electrical contact 15 tapers from the neck portion 153 of the electrical contact 15.

Likewise, the electrical contact 17 also has a neck portion 173 between the portions 171 and 172 of the electrical contact 17 (see FIG. 1A). The neck portion 173 of the electrical contact 171 and the lower surface 121 of the insulation layer 12 are substantially disposed at the same elevation. Further, the portion 172 of the electrical contact 17 tapers from the neck portion 173 of the electrical contact 17.

Further, referring to FIG. 1A, since the portion 152 of the electrical contact 15 tapers from the neck portion 153 of the electrical contact 15 and the portion 172 of the electrical contact 17 tapers from the neck portion 173 of the electrical contact 17, the distance D1 between the portion 152 of the electrical contact 15 and the portion 172 of the electrical contact 17 is larger than or equal to the distance D2 between the neck portion 153 of the electrical contact 15 and the neck portion 173 of the electrical contact 17.

Figure 2A:
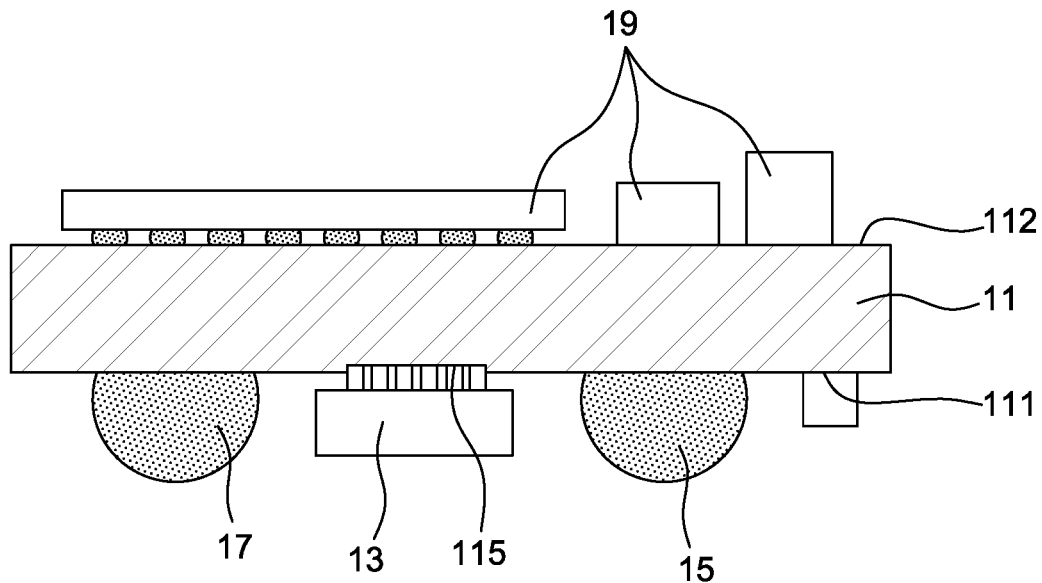
FIG. 2A, FIG. 2B, FIG. 2C, FIG. 2D, FIG. 2E and FIG. 2F show a method of manufacturing a semiconductor device package in accordance with an embodiment of the instant disclosure.

FIG. 2A, FIG. 2B, FIG. 2C, FIG. 2D, FIG. 2E and FIG. 2F show a method of manufacturing a semiconductor device package 1 in accordance with an embodiment of the instant disclosure. As shown in FIG. 2A, at least one electronic component 13 and two electrical contacts 15 and 17 are disposed on the lower surface 111 of the substrate 11, wherein the at least one electronic component 13 could be a die and the electrical contacts 15 and 17 could be solder balls. Preferably, the electronic component 13 is disposed in the recess 115 and electrically connects to the substrate 11. One or more electronic components 19 are disposed on the upper surface 112 of the substrate 11.

Figure 2B:
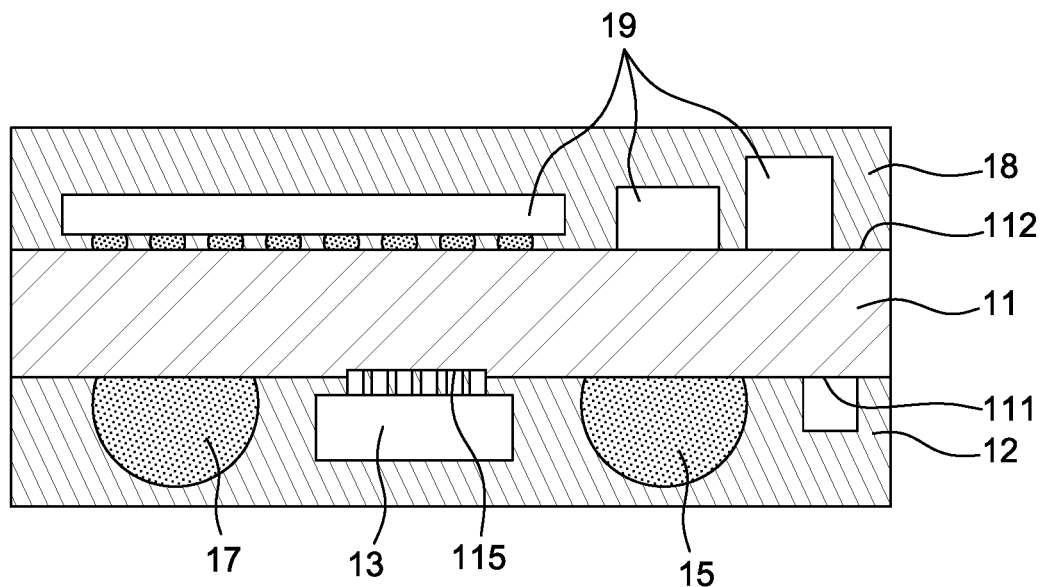

With reference to FIG. 2B, the insulation layer 12 is disposed on the upper surface 111 of the substrate 11 and encapsulates the at least one electronic component 13 and the electrical contacts 15 and 17. The insulation layer 12 comprises an encapsulation material with a plurality of fillers 127. Moreover, the insulation layer 19 is disposed on the upper surface 111 of the substrate 1 and encapsulates the electronic components 19.

Figure 2C:
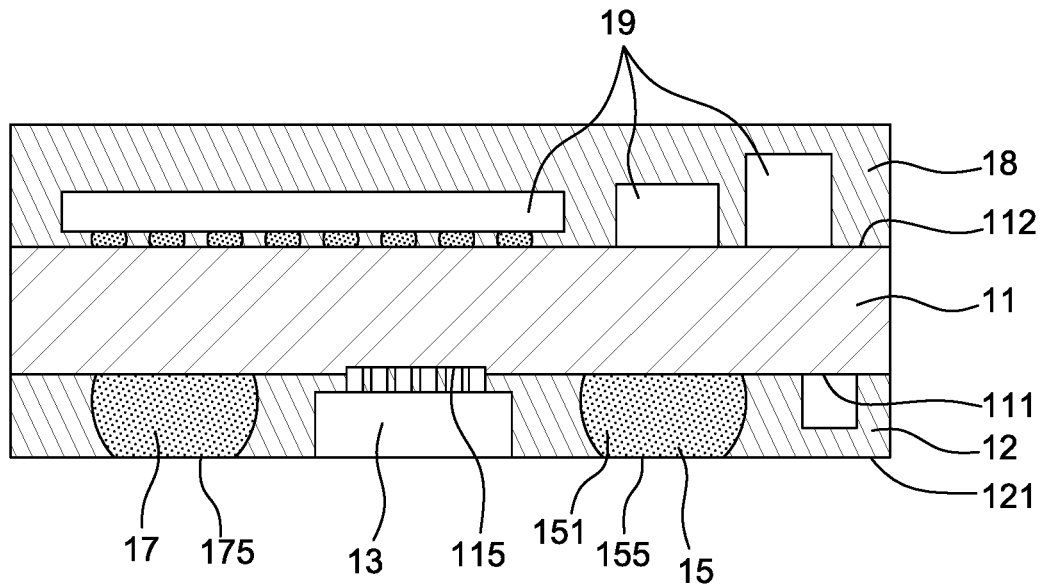

With reference to FIG. 2C, a portion of the insulation layer 12, a portion of the electrical contact 15 and a portion of the electrical contact 17 are removed by grinding or ablating technique to expose surfaces 155, 175 of the electrical contacts 15, 17. The lower surface 121 of insulation layer 12 is coplanar with the surfaces 155 of the electrical contact 15. The lower surface 121 of insulation layer 12 is coplanar with the surface 175 of the electrical contact 17. The remaining portions of the electrical contacts 15 and 17 in the insulation layer 12 form the portions 151 and 171 of the electrical contacts 15 and 17. Moreover, since a portion of the insulation layer 12 is removed by grinding or ablating, at least one filler 127 in the insulation layer 12 will be grinded or ablated as well. That is, a portion of the at least one filler 127 will be removed and the at least one filler 127 will have a surface exposing from the insulation layer 12 and coplanar with the lower surface 121 of the insulation layer 12.

Figure 2D:
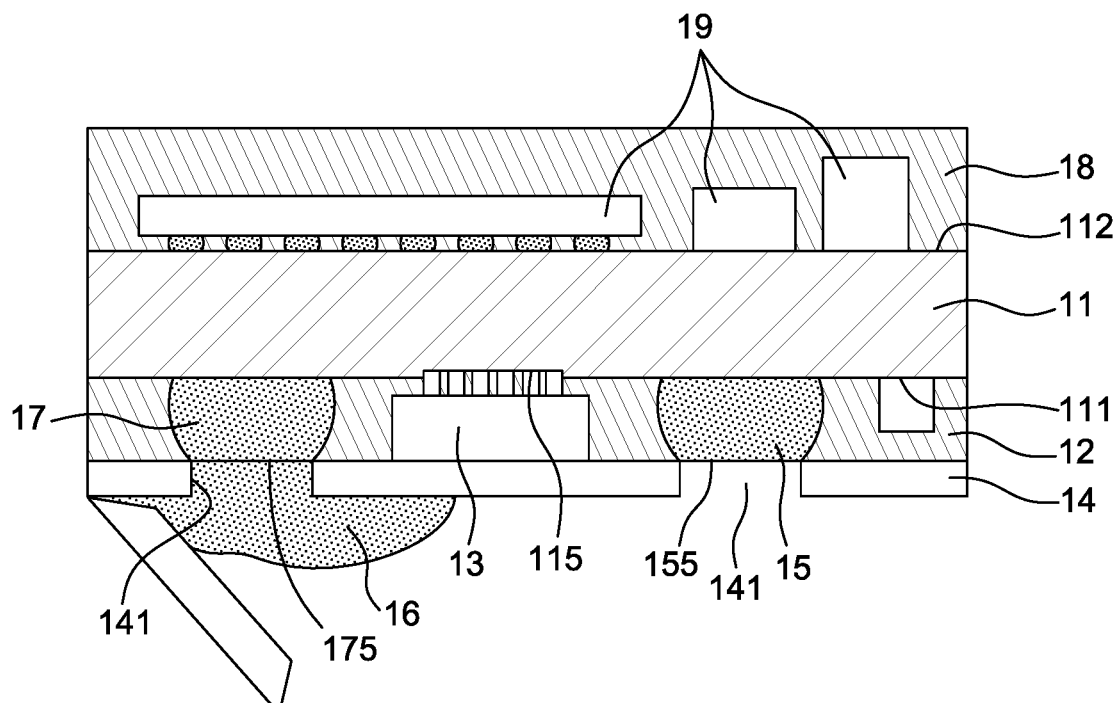

With reference to FIG. 2D, a mask 14 with a plurality of through holes 141 is arranged on the lower surface 121 of the insulation layer 12, wherein the through holes 141 substantially align with the exposed surface 155 of the electrical contact 15 and the exposed surface 175 of the electrical contact 17 respectively. After the mask 14 is arranged on the lower surface 121 of the insulation layer 12, the solder paste 16 is dispensed on the mask 14 and filled into the through holes 141 of the mask 14. The solder paste 16 is printed on the exposed surface 155 of the electrical contact 15 and the exposed surface 175 of the electrical contact 17 and then fused with the portion 151 of the electrical contact 15 and the portion 171 of the electrical contact 17. The solder paste 16 includes Tin beads and flux, and any Oxide layer on the electrical contacts can be eliminated and a melt point of the electrical contacts can be depressed by the flux.

Figure 2E:
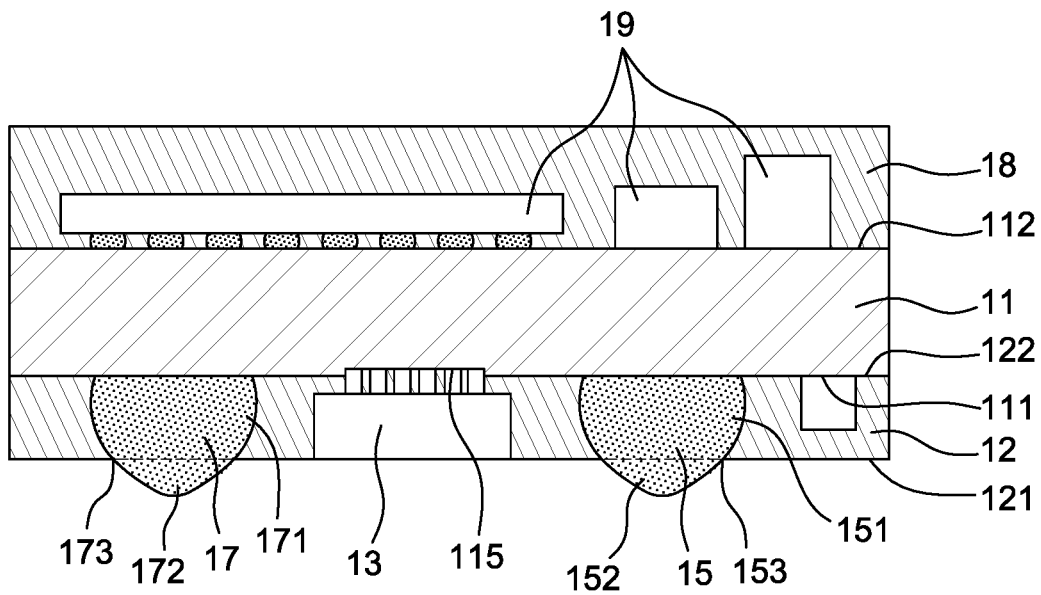

With reference to FIG. 2E, after the solder paste 16 is filled into the through holes 141 of the mask 14, the mask 14 could be removed from the insulation layer 12. The solder paste 16 printed on the portion 151 of the electrical contact 15 and the portion 171 of the electrical contact 17 forms a portion 152 on the portion 151 of the electrical contact 15 and a portion 172 on the portion 171 of the electrical contact 17. Moreover, there are a neck portion 153 formed between the portions 151 and 152 of the electrical contact 15 and a neck portion 173 formed between the portions 171 and 172 of the electrical contact 17. The portion 152 of the electrical contact 15 tapers from the neck portion 153 of the electrical contact 15 and the portion 172 of the electrical contact 17 tapers from the neck portion 173 of the electrical contact 17. Moreover, since the portions 152 and 172 of the electrical contacts 15, 17 are formed by printing the solder paste 16 with the mask 14, the thicknesses of the portions 152 and 172 of the electrical contacts 15, 17 could be readily controlled and be substantially unified. The thickness of the mask 14 is around 25 um-50 um, and thus the thickness of the portion 152, 172 will be greater or equal to 30 um. That is, the electrical contacts 15, 17 could be well connected to the motherboard (or external PCB). Moreover, a cross-sectional width of the f neck portion 153 of the electrical contact 15 is equal to or greater than ninety percent of the largest cross-sectional width of the portion 151 of the electrical contact 15, wherein the cross-sectional width of the neck portion 153 is in a range from about 0.18 mm to 0.225 mm. Likewise, a cross-sectional width of the neck portion 173 of the electrical contact 17 is equal to or greater than ninety percent of the largest cross-sectional width of the portion 171 of the electrical contact 17, wherein the cross-sectional width of the neck portion 173 is in a range from about 0.18 mm to 0.225 mm.

Figure 2F:
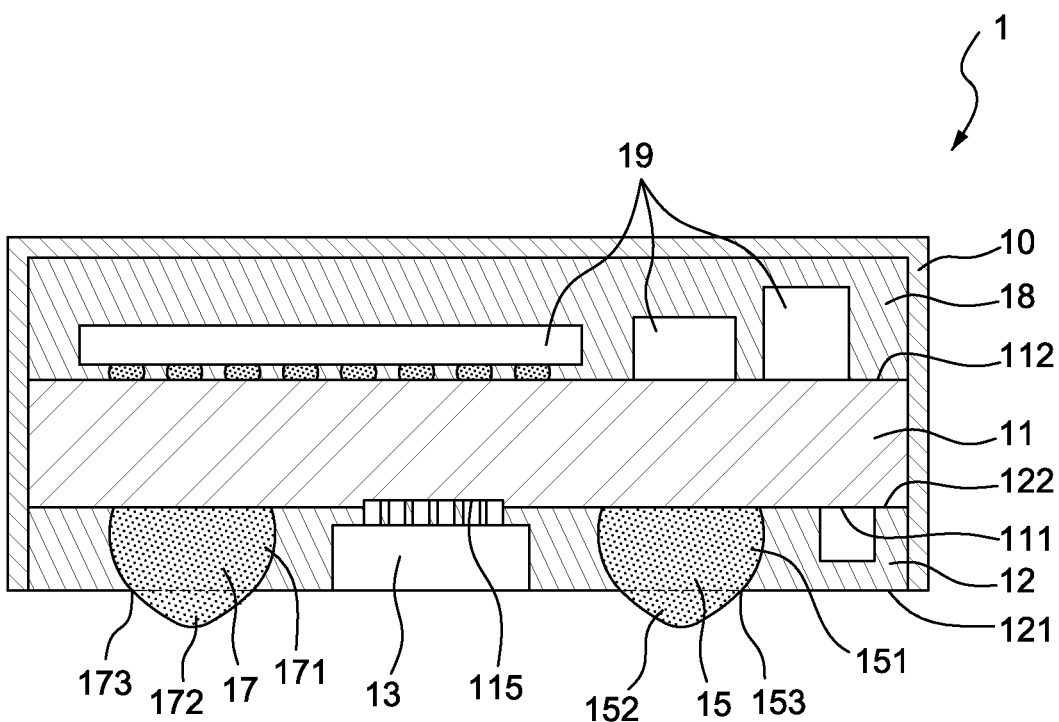

With reference to FIG. 2F, a conductive layer 10 is disposed on the insulation layer 18 and substantially surrounds a lateral surface of the substrate 11 and a lateral surface of the insulation layer 12.

Figure 3A:
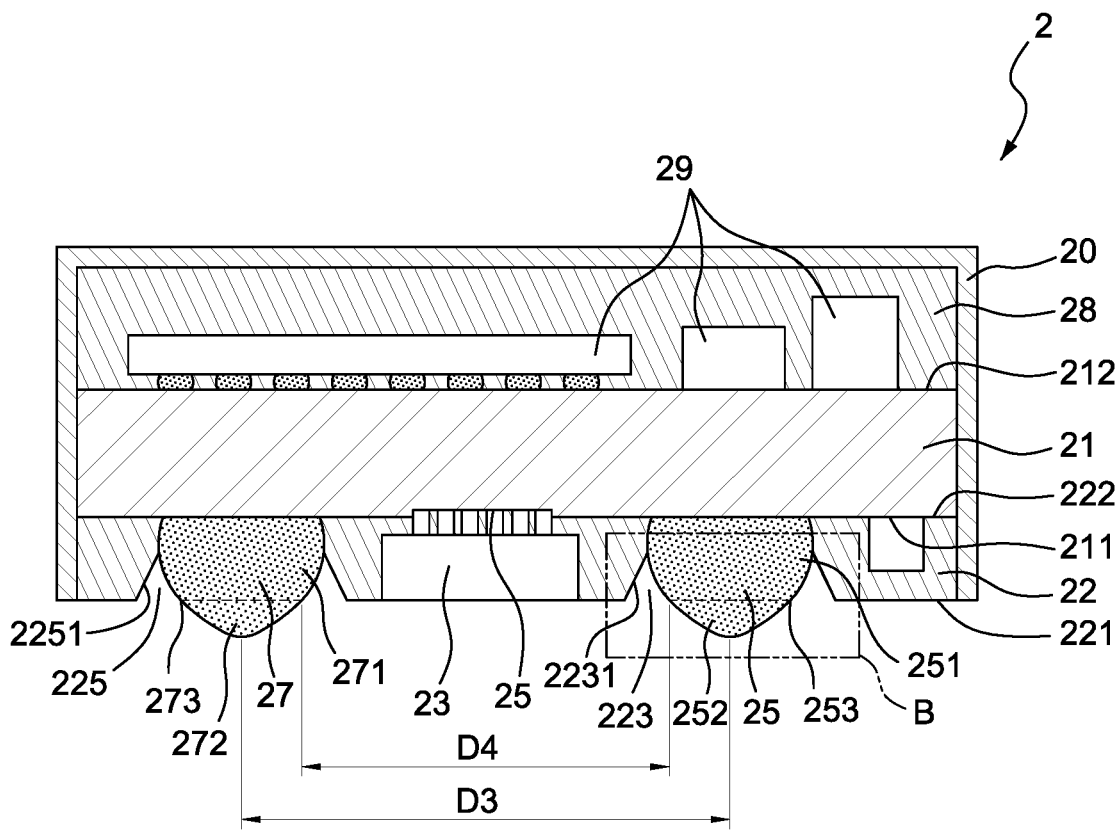
FIG. 3A is a cross-sectional view of a semiconductor device package in accordance with another embodiment of the instant disclosure.

FIG. 3A shows a semiconductor device package 2 in accordance with another embodiment of the instant disclosure. With reference to FIG. 2A, the semiconductor device package 1 of this embodiment includes a substrate 21. The substrate 21 has a lower surface 211 and an upper surface 212 opposite to the lower surface 211. An insulation layer 22 comprises an encapsulation material and is disposed on the lower surface 211 of the substrate 21. The insulation layer 22 has a lower surface 221 and an upper surface 222 which is opposite to the lower surface 221 of the insulator 22 and substantially attached to the lower surface 211 of the substrate 21. At least one electronic component 23 is disposed on the lower surface 211 of the substrate 21 and surrounded or encapsulated by the insulation layer 22. Moreover, the lower surface 211 of the substrate 21 has a recess 215. The at least one electronic component 23 is disposed in the recess 215 and electrically connected to the substrate 21.

The semiconductor device package 2 further comprises two electrical contacts 25 and 27 which are used as external terminals to a motherboard. The insulation layer 22 has a side wall 2231 and such side wall 2231 forms a cavity 223 on the lower surface 221 of the insulation layer 22. The electrical contact 25 is disposed on the lower surface 211 of the substrate 21 and substantially received within the cavity 223 of the insulation layer 22. Further, the electrical contact 25 has a portion 251 surrounded by the insulation layer 22 and a portion 252 exposed from the lower surface 221 of the insulation layer 22. Since the electrical contact 25 is substantially within the cavity 223, a portion of the lateral surface of the f portion 251 of the electrical contact 25 will be exposed from the insulation layer 22. In other words, a portion of the lateral surface of the portion 251 of the electrical contact 25 will be separated from the side wall 2231 of the f insulation layer 22. Moreover, the portion 252 of the electrical contact 25 is substantially disposed on the portion 251 of the electrical contact 25 and protrudes from the elevation of the lower surface 221 of the insulation layer 22. Likewise, the insulation layer 22 also has a side wall 2251 and such side wall 2251 forms a cavity 225 on the lower surface 221 of the insulation layer 22. The electrical contact 27 is disposed on the lower surface 211 of the substrate 21 and substantially received within the cavity 225 of the insulation layer 22. Further, the electrical contact 27 has a portion 271 surrounded by the insulation layer 22 and a portion 272 exposed from the lower surface 221 of the insulation layer 22. Since the electrical contact 27 is substantially within the cavity 225, a portion of the lateral surface of the portion 271 of the s electrical contact 27 will be exposed from the insulation layer 22. In other words, a portion of the lateral surface of the portion 271 of the electrical contact 27 will be separated from the side wall 2251 of the insulation layer 22. Moreover, the portion 272 of the electrical contact 27 is substantially disposed on the portion 271 of the electrical contact 27 and protrudes from the elevation of the lower surface 221 of the insulation layer 22.

Moreover, the semiconductor device package 2 comprises another insulation layer 28 disposed on the upper surface 212 of the substrate 21. One or more electronic components 29 are disposed on the upper surface 212 of the substrate 21 and substantially encapsulated by the insulation layer 28. In addition, a conductive layer 20 is disposed on the insulation layer 28 and substantially surrounds a lateral surface of the substrate 21 and a lateral surface of the insulation layer 22.

Figure 3B:
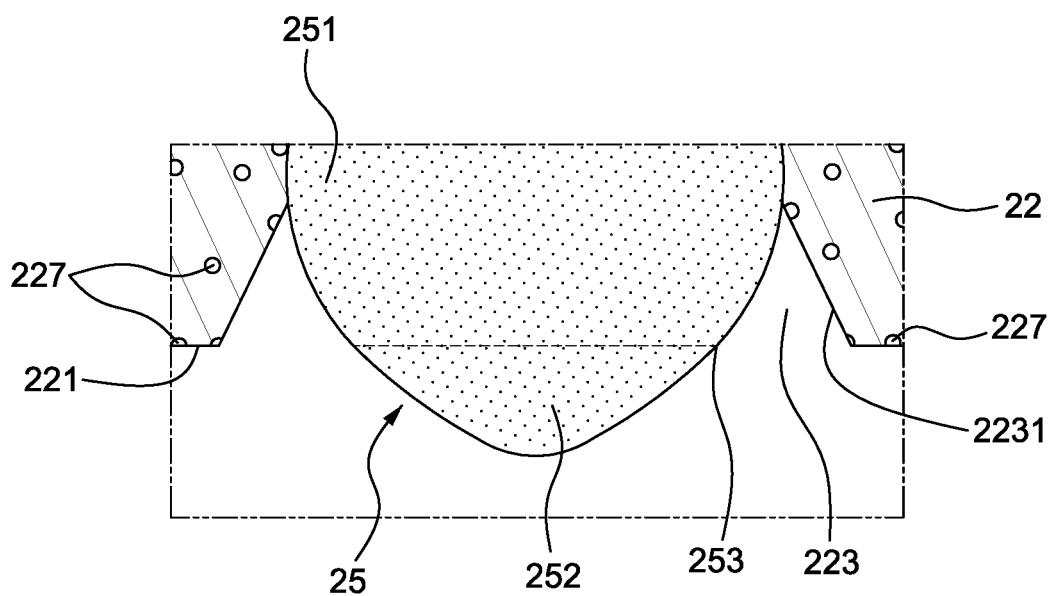
FIG. 3B is an enlarged view of portion "B" in FIG. 3A.

FIG. 3B is a partial enlarged view of portion "B" in FIG. 3A. With reference to FIG. 3B, the insulation layer 22 has a plurality of fillers 227, wherein at least one of the fillers 227 has a surface coplanar with the lower surface 221 of the insulation layer 22. Further, the electrical contact 25 has a neck portion 253 between the portions 251 and 252 of the electrical contact 25 and the neck portion 253 and the lower surface 221 of the insulation layer 22 are substantially disposed at the same elevation. In addition, as shown in FIG. 1B, the portion 252 of the electrical contact 125 tapers from the neck portion 253 of the electrical contact 25.

Likewise, the electrical contact 27 also has a neck portion 273 between the portions 271 and 272 of the electrical contact 27 (see FIG. 3A). The neck portion 273 of the electrical contact 271 and the lower surface 221 of the insulation layer 22 are substantially disposed at the same elevation. Further, the portion 272 of the electrical contact 27 tapers from the neck portion 273 of the electrical contact 27.

Further, referring to FIG. 3A, since the portion 252 of the electrical contact 25 tapers from the neck portion 253 of the electrical contact 25 and the portion 272 of the electrical contact 27 tapers from the neck portion 273 of the electrical contact 27, the distance D3 between the portion 252 of the electrical contact 25 and the portion 272 of the electrical contact 27 is larger than or equal to the distance D4 between the neck portion 253 of the electrical contact 25 and the neck portion 273 of the electrical contact 27.

Figure 4A:
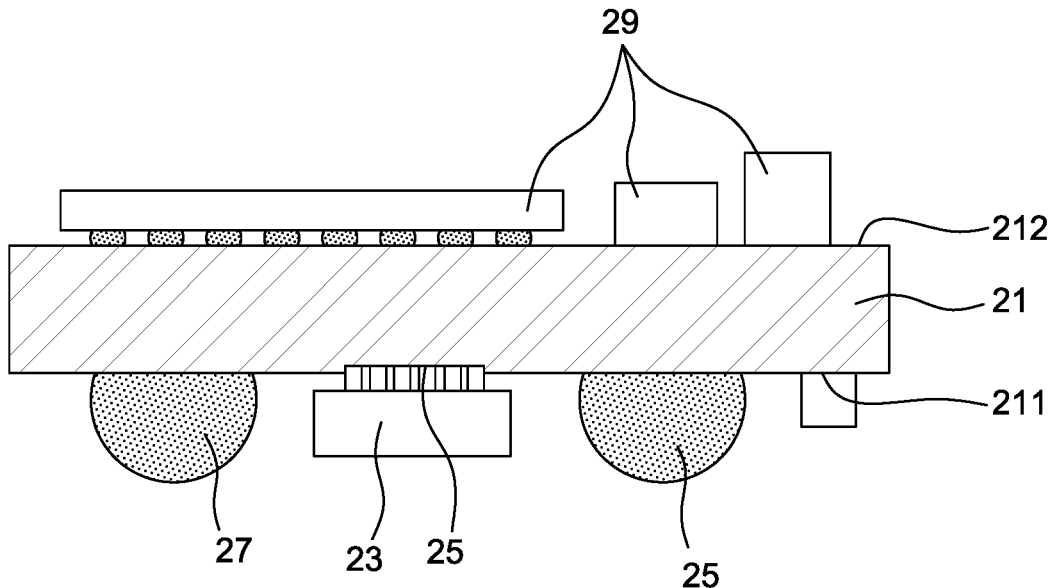
FIG. 4A, FIG. 4B, FIG. 4C, FIG. 4D, FIG. 4E, FIG. 4F and FIG. 4G show a method of manufacturing a semiconductor device package in accordance with another embodiment of the instant disclosure.

FIG. 4A, FIG. 4B, FIG. 4C, FIG. 4D, FIG. 4E, FIG. 4F and FIG. 4G show a method of manufacturing a semiconductor device package 2 in accordance with another embodiment of the instant disclosure. As shown in FIG. 4A, at least one electronic component 23 and two electrical contacts 25 and 27 are disposed on the lower surface 211 of the substrate 21, wherein the at least one electronic component 23 could be a die and the electrical contacts 25, 27 could be solder balls. Preferably, the f electronic component 23 is disposed in the recess 215 and electrically connects to the substrate 21. One or more s electronic components 29 are disposed on the upper surface 212 of the substrate 21.

Figure 4B:
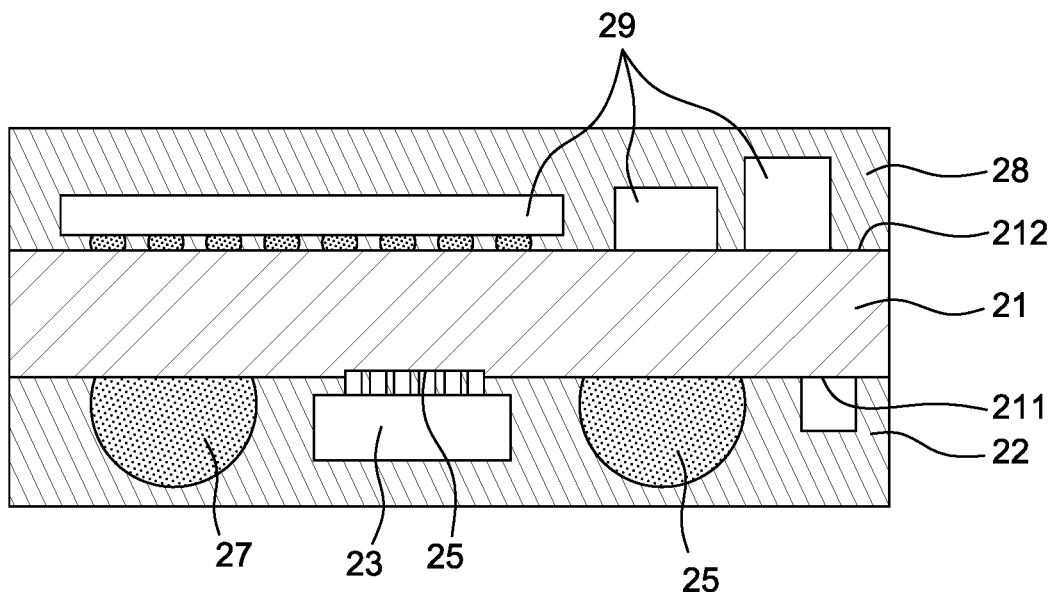

With reference to FIG. 4B, the insulation layer 22 is disposed on the lower surface 211 of the substrate 21 and encapsulates the at least one electronic component 23 and the electrical contacts 25 and 27. The insulation layer 22 comprises an encapsulation material with a plurality of fillers 227. Moreover, the insulation layer 29 is disposed on the supper surface 211 of the substrate and encapsulates the electronic components 29.

Figure 4C:
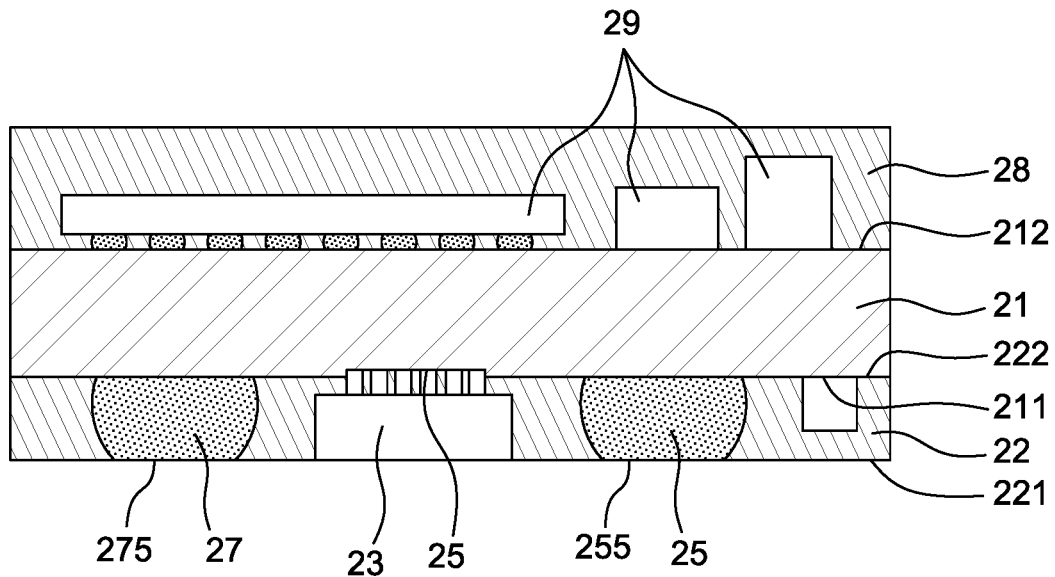

With reference to FIG. 4C, a portion of the insulation layer 22, a portion of the electrical contact 25 and a portion of the electrical contact 27 are removed by grinding or ablating to expose surfaces 255, 275 of the electrical contacts 25, 27. The lower surface 221 of the insulation layer 22 is coplanar with the surfaces 255 of the electrical contact 25. The lower surface 221 of the insulation layer 22 is coplanar with the surfaces 275 of the electrical contact 27. The remaining portions of the electrical contacts 25 and 27 in the insulation layer 12 form the portion 251 of the electrical contact 25 and the portion 271 of the electrical contact 27. Moreover, since a portion of the insulation layer 22 is removed by grinding or ablating, at least one filler 227 in the insulation layer 22 will be grinded or ablated as well. That is, a portion of the at least one filler 227 will be removed and the at least one filler 227 will have a surface exposing from the insulation layer 22 and coplanar with the lower surface 221 of the insulation layer 22.

Figure 4D:
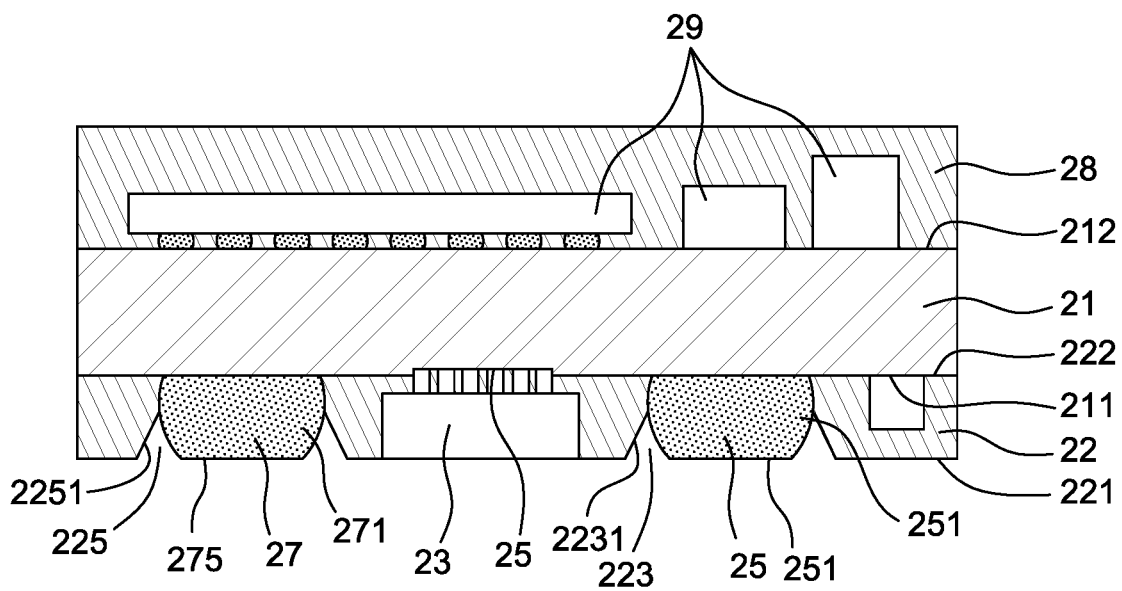

With reference to FIG. 4D, portions of the insulation layer 22 adjacent to the and electrical contacts 25, 27 are further removed by ablated such that the insulation layer 22 further has side walls 2231 and 2251, wherein the side wall 2231 substantially surrounds the electrical contact 25 and is separated from a portion of the lateral surface of the portion 251 of the electrical 25 and the side wall 2251 substantially surrounds the electrical contact 27 and is separated from a portion of the lateral surface of the portion 271 of the electrical contact 27. That is, the side wall 2231 of the insulation layer 22 forms a cavity 223 concaved from the lower surface 221 of the insulation layer 22 and the side wall 2251 of the insulation layer 22 forms a cavity 223 concaved from the lower surface 221 of the insulation layer 22. Moreover, since the side wall 2231 of the insulation layer 22 is separated from a portion of the lateral surface of the portion 251 of the electrical 25 and the side wall 2251 of the insulation layer 22 is separated from a portion of the lateral surface of the portion 271 of the electrical contact 27, a portion of the lateral surface of the portion 251 of the electrical 25 and a portion of the lateral surface of the portion 271 of the electrical contact 27 are exposed from the insulation layer 22.

Figure 4E:
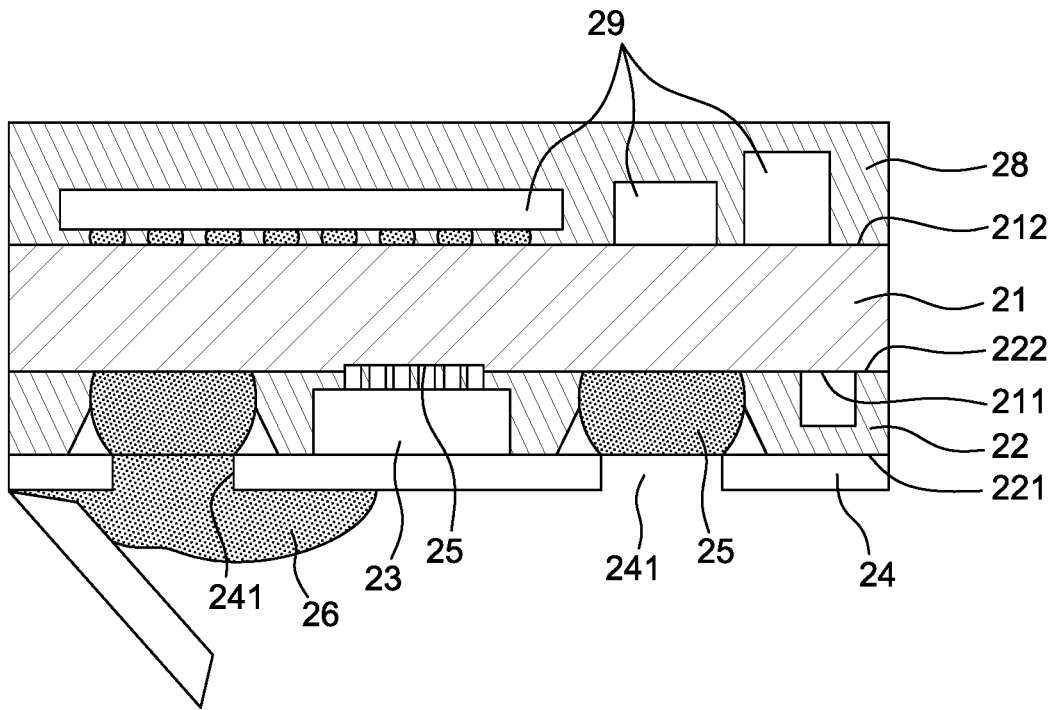

With reference to FIG. 4E, a mask 24 with a plurality through holes 241 is arranged on the lower surface 221 of the insulation layer 22, wherein the through holes 241 substantially align with the exposed surface 255 of the electrical contact 25 and the exposed surface 275 of the electrical contact 27 respectively. After the mask 24 is arranged on the lower surface 221 of the insulation layer 22, the solder paste 26 is dispensed on the mask 24 and filled into the through holes 241 of the mask 24. The solder paste 26 is printed on the exposed surface 255 of the electrical contact 25 and the exposed surface 275 of the electrical contact 27 and then fused with the portion 251 of the electrical contact 25 and the portion 271 of the electrical contact 27. The solder paste 26 includes Tin beads and flux, and any Oxide layer on the electrical contacts can be eliminated and a melt point of the electrical contacts can be depressed by the flux.

Figure 4F:
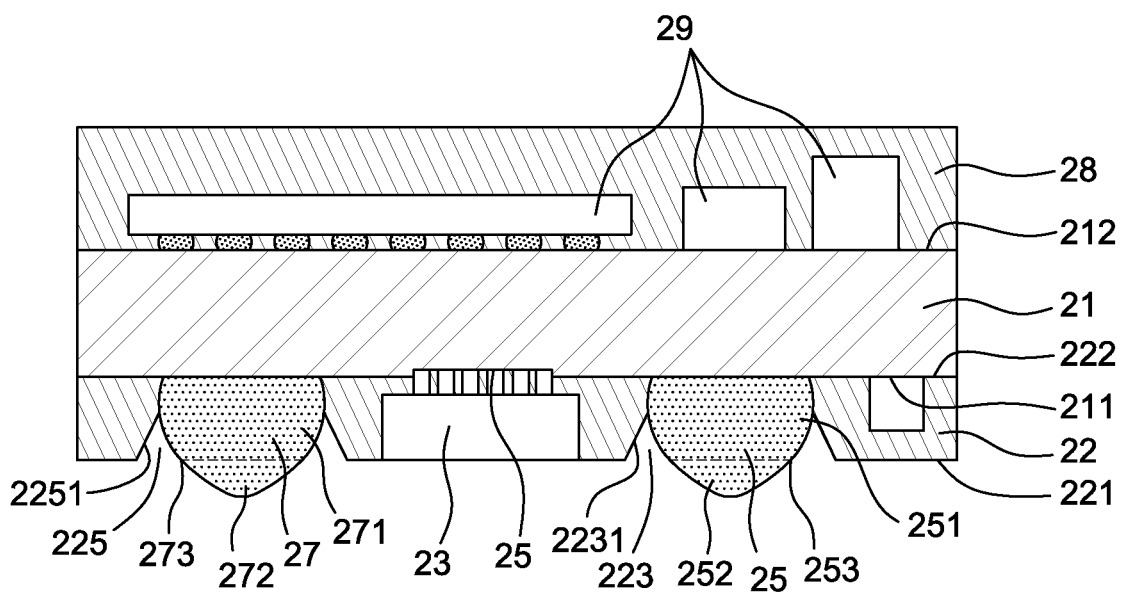

With reference to FIG. 4F, after the solder paste 26 is filled into the through holes 241 of the mask 24, the mask 24 could be removed from the insulation layer 22. The solder paste 26 printed on the portion 251 of the electrical contact 25 and the portion 271 of the electrical contact 27 forms a portion 252 on the portion 251 of the electrical contact 25 and a portion 272 on the portion 271 of the electrical contact 27. Moreover, a neck portion 253 is formed between the portions 251 and 252 of the t electrical contact 25, and a neck portion 273 is formed between the portions 271 and 272 of the electrical contact 27. The portion 252 of the electrical contact 25 tapers from the neck portion 253 of the electrical contact 25 and the portion 272 of the electrical contact 27 tapers from the neck portion 273 of the electrical contact 27. Moreover, since the portions 252 and 272 of the electrical contacts 25, 27 are formed by printing the solder paste 26 with the mask 24, the thickness of the portions 252 and 272 of the electrical contacts 25, 27 could be readily controlled and be substantially unified. The thickness of the mask 24 is around 25 um-50 um, and thus the thickness of the portion 252, 272 will be greater than or equal to 30 um. That is, the electrical contacts 25, 27 could be well connected to the motherboard (or external PCB). Moreover, a cross-sectional width of the neck portion 253 of the electrical contact 25 is equal to or greater than ninety percent of the largest cross-sectional width of the t portion 251 of the electrical contact 25, wherein the cross-sectional width of the neck portion 253 is in a range from about 0.18 mm to 0.225 mm. Likewise, a cross-sectional width of the neck portion 273 of the electrical contact 27 is equal to or greater than ninety percent of the largest cross-sectional width of the portion 271 of the electrical contact 27, wherein the cross-sectional width of the neck portion 273 is in a range from about 0.18 mm to 0.225 mm.

Figure 4G:
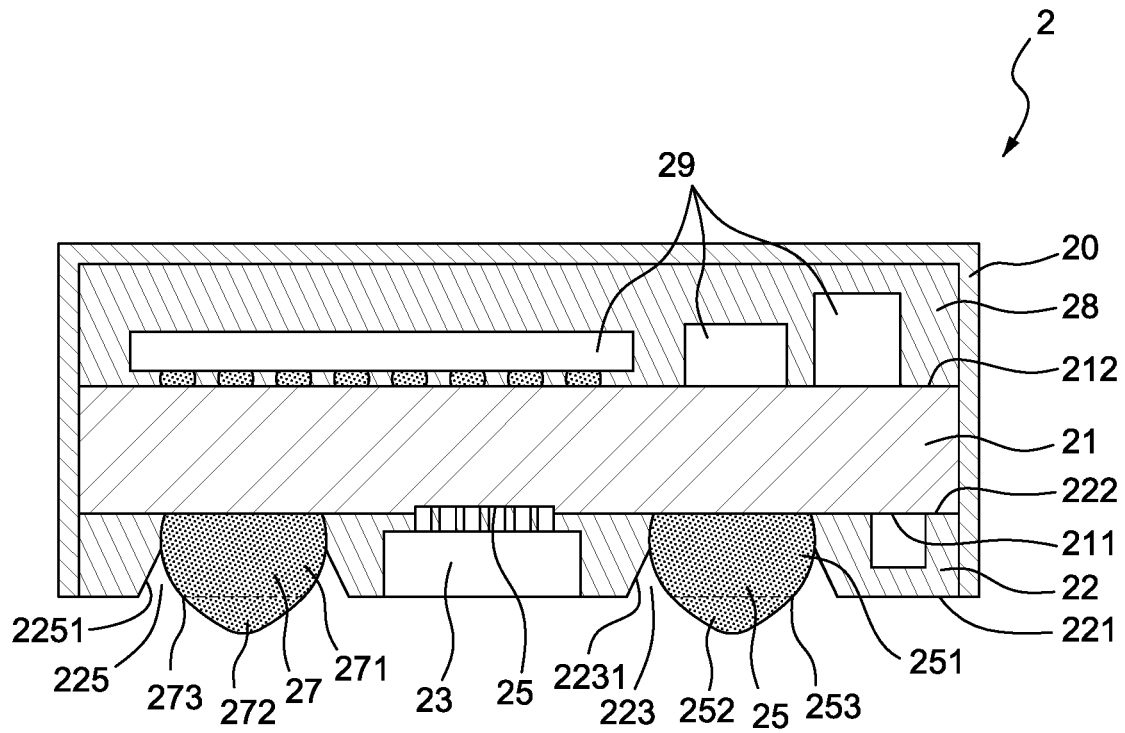

With reference to FIG. 4G, a conductive layer 20 is disposed on the insulation layer 28 and substantially surrounds a lateral surface of the substrate 21 and a lateral surface of the insulation layer 22.

Figure 5:
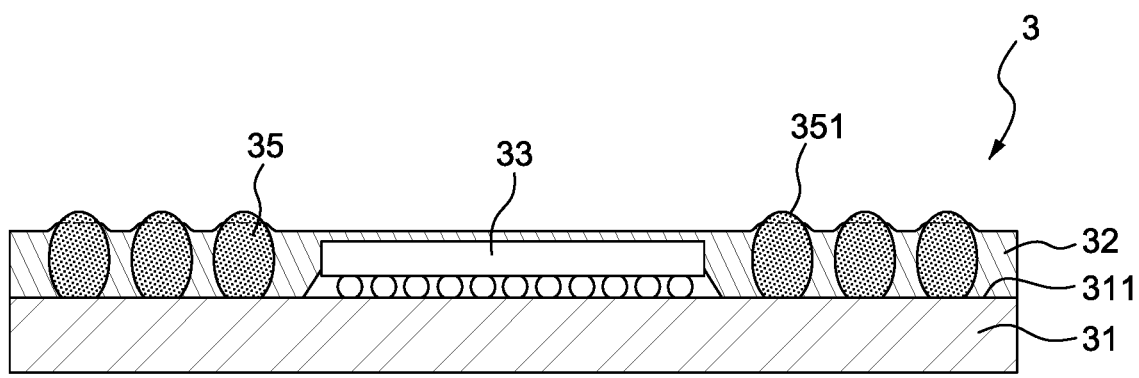
FIG. 5 is a cross-sectional view of a semiconductor device package in accordance with another embodiment of the instant disclosure.

FIG. 5 shows a semiconductor device package 3 in accordance with another embodiment of the instant disclosure. With reference to FIG. 5, the semiconductor device package 3 of this embodiment includes a substrate 31. The substrate 31 has an upper surface 311. An insulation layer 32 is disposed on the upper surface 311 of the substrate 31. A plurality of solder balls 35 is disposed on the upper surface 311 of the substrate 31, wherein each solder ball 35 is surrounded by the insulation layer 32 and has an exposed surface 351 exposed through the insulation layer 32. The exposed surfaces 351 of the solder balls 35, 37 are used for connecting areas of the semiconductor device package 3.

Figure 6A:
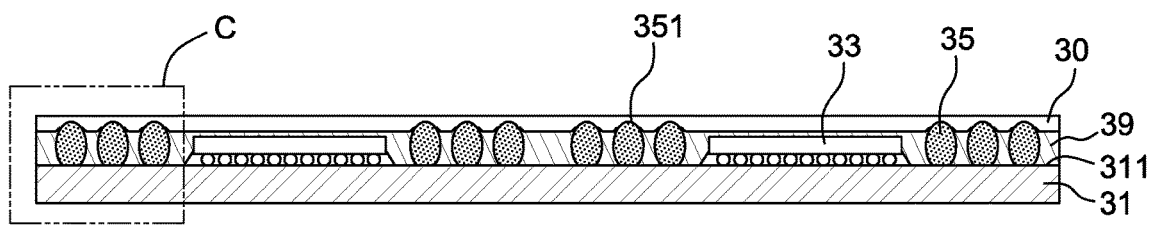
FIG. 6A and FIG. 6B show a method of manufacturing a semiconductor device package in accordance with another embodiment of the instant disclosure.
Figure 6B:
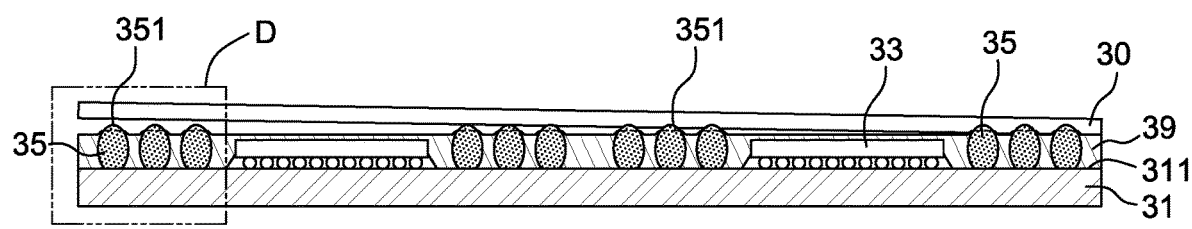

FIGS. 6A and 6B show a method of manufacturing a semiconductor device package 3 in accordance with another embodiment of the instant disclosure. With reference to FIG. 6A, the solder balls 35 and the electrical components 33 are disposed on the upper surface 311 of the substrate 31. A release film 30 is arranged on the solder balls 35 and substantially covers the exposed surfaces 351 of the solder balls 35. Further, the molding compound 39 is filled into the space between the release film 30 and the substrate 31. With reference to FIG. 6B, the molding compound 39 forms the insulation layer 32 on the upper surface 311 of the substrate 31. The insulation layer 32 encapsulates the electronic elements 33 and surrounds the solder balls 35. After the molding compound 39 forms the insulation layer 32, the release film 30 is removed from the solder balls 35. Since the exposed surfaces 351 of the solder balls 35 are covered by the release film, the exposed surfaces 351 of the solder balls 35 are not encapsulated by the insulation layer 32 and are exposed through the insulation layer 32.

Figure 6C:
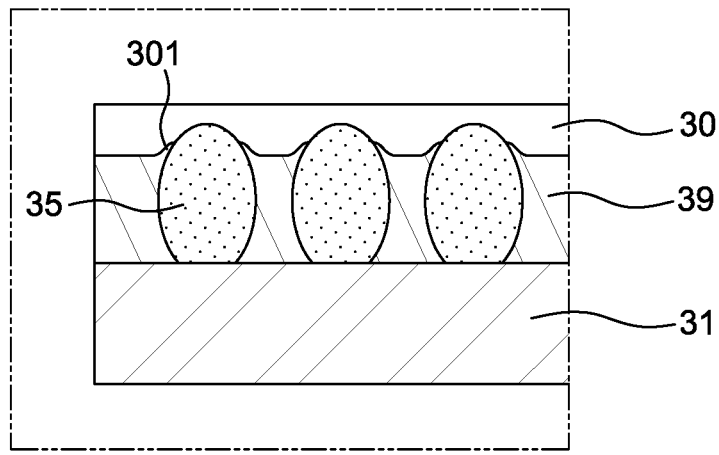
FIG. 6C is an enlarged view of portion "C" in FIG. 6A.
Figure 6D:
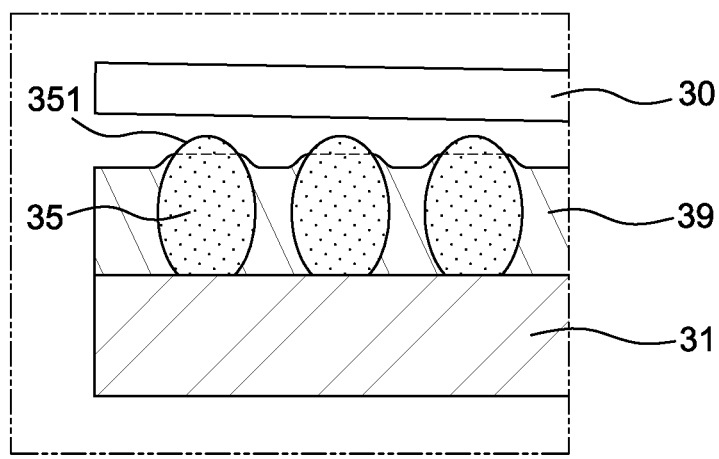
FIG. 6D is an enlarged view of portion "D" in FIG. 6B.

However, with reference FIG. 6C, when the molding compound 39 is filled into the space between the release film 30 and the substrate 31, the flow of the molding compound 39 will make a gap 301 between the release film and the exposed surface 351 of the solder ball 35. Meanwhile, the molding compound 39 may flow into the gap 301 such that the area of the exposed surface 351 of the solder ball 35 is diminished (see FIG. 6D). As a result, the exposed surface 351 of the solder ball 35 will not have sufficient connecting area to contact a pad of the PCB.

Figure 7:
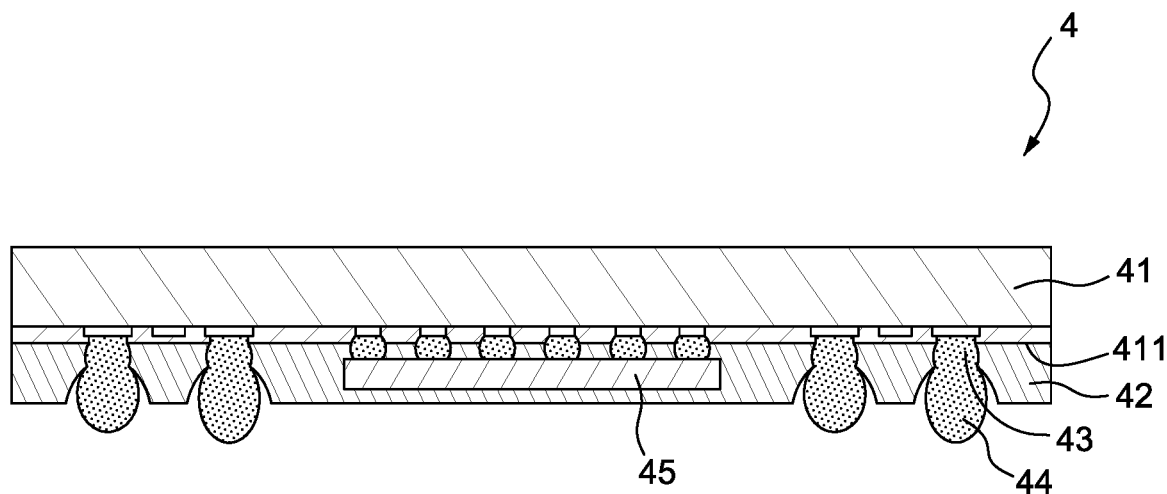
FIG. 7 is a cross-sectional view of a semiconductor device package in accordance with another embodiment of the instant disclosure.

FIG. 7 shows a semiconductor device package 4 in accordance with another embodiment of the instant disclosure. With reference to FIG. 7, the semiconductor device package 4 of this embodiment includes a substrate 41. The substrate 41 has a surface 411. An insulation layer 42 is disposed on the surface 411 of the substrate 41. Multiple solder balls 43 are disposed on the surface 411 of the substrate 31 and surrounded by the insulation layer 42. Multiple solder balls 44 are connected to the solder balls 43 respectively and exposed through the insulation layer 42.

Figure 8A:
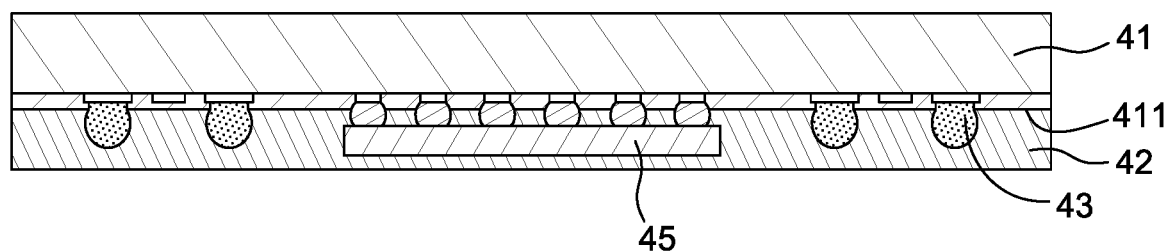
FIG. 8A, FIG. 8B and FIG. 8C show a method of manufacturing a semiconductor device package in accordance with another embodiment of the instant disclosure.
Figure 8B:
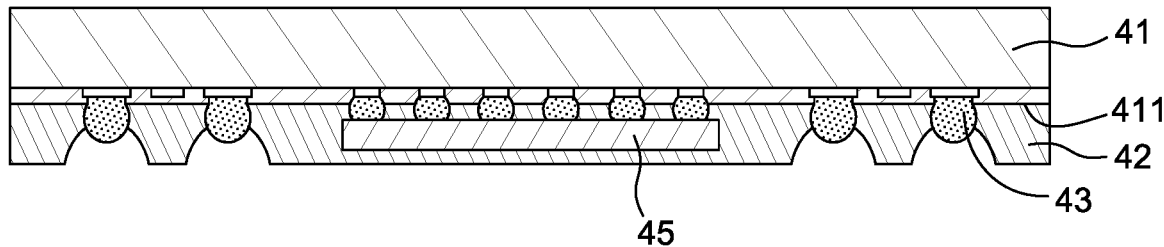
Figure 8C:
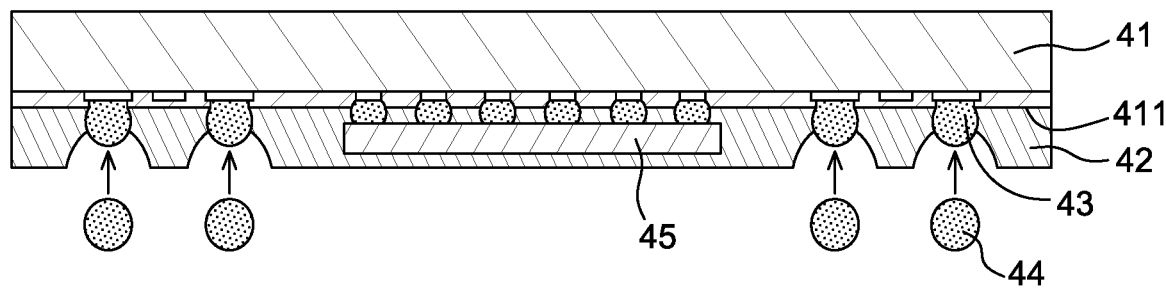

FIG. 8A, FIG. 8B and FIG. 8C show a method of manufacturing a semiconductor device package 4 in accordance with another embodiment of the instant disclosure. With reference to FIG. 8A, the solder balls 43 and the electrical components 45 are disposed on the surface 411 of the substrate 41. The insulation layer 42 is disposed on the surface 411 of the substrate 41 and encapsulates the solder balls 43 and the electrical components 45. With reference to FIG. 8B, the portions of the insulation layer 42 adjacent to the solder balls 43 are removed such that each solder ball 43 has a portion exposed from the insulation layer 42. With reference to FIG. 8C, the solder balls 44 are jointed at the exposed portions of the solder balls 43 respectively such that the solder balls 44 and the solder balls 43 are connected to each other.

However, since the solder ball 44 will reflow to the solder ball 43 when the solder ball 44 is jointed to the solder ball 43, the total thickness of the solder balls 43 and 44 will be difficult to control. As a result, the tops of the solder balls 44 of the semiconductor device package 4 may not be at the same elevation.

Figure 9:
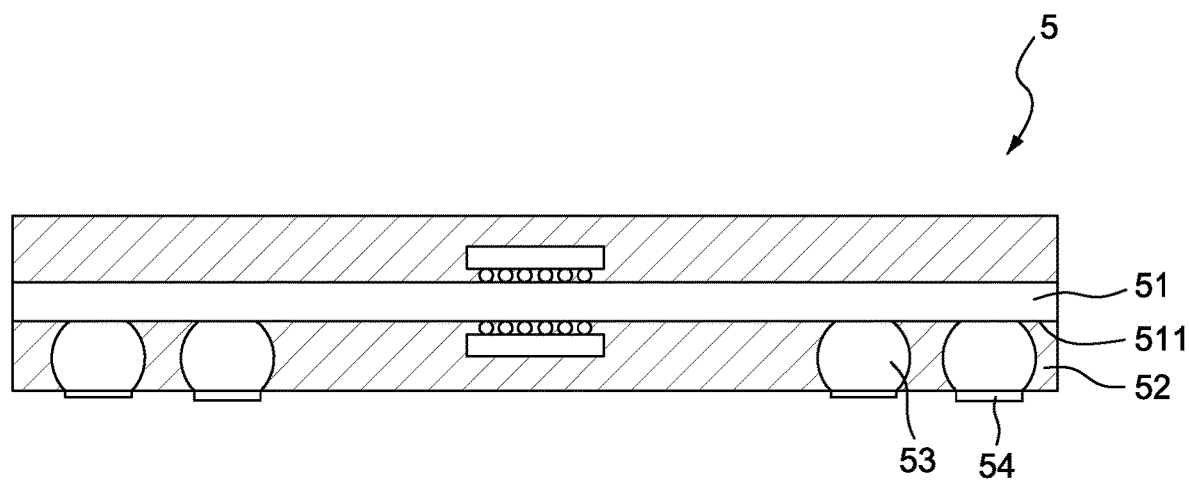
FIG. 9 is a cross-sectional view of a semiconductor device package in accordance with another embodiment of the instant disclosure.

FIG. 9 shows a semiconductor device package 5 in accordance with another embodiment of the instant disclosure. With reference to FIG. 9, the semiconductor device package 5 of this embodiment includes a substrate 51. The substrate 51 has a surface 511. An insulation layer 52 is disposed on the surface 511 of the substrate 51. Multiple solder balls 53 are disposed on the surface 511 of the substrate 51 and surrounded by the insulation layer 52. Multiple solder pads 54 are disposed on the solder balls 53 respectively and exposed through the insulation layer 52.

However, the solder pads 54 will reflow into the solder balls 53 when the solder pads 54 are disposed on the solder balls 53. That is, the total thickness of the solder ball 53 and the solder pad 54 will be difficult to control. As a result, the tops of the solder pads 54 of the semiconductor device package 5 may not be at the same elevation.

The above embodiments merely describe the principle and effects of some embodiments of the present disclosure, instead of limiting the present disclosure. Therefore, persons skilled in the art can make modifications to and variations of the above embodiments without departing from the spirit of the present disclosure. The scope of the present disclosure should be defined by the appended claims.

What is claimed is:

1. A semiconductor device package, comprising:
   a substrate having a first surface;
   a first insulation layer disposed on the first surface of the substrate and having a first surface facing away from the substrate; and
   a first electrical contact disposed on the first surface of the substrate; wherein the first electrical contact has a portion under an elevation of the first surface of the first insulation layer;
   wherein the first insulation layer has an inclined surface toward the first electrical contact, forming a cavity, and wherein the inclined surface and the portion of the first electrical contact are non-overlapping in a first direction substantially perpendicular to the first surface of the substrate.

2. The semiconductor device package of claim 1, further comprising a conductive layer disposed at a lateral side surface of the substrate and a lateral side surface of the first insulation layer, wherein the conductive layer and the first insulation layer are overlapping in a direction substantially parallel to the first surface of the substrate.

3. A semiconductor device package, comprising:
   a substrate having a first surface and a second surface opposite to the first surface;
   a first electrical contact disposed under the first surface of the substrate;
   a first electronic component under the first surface of the substrate;
   a second electronic component over the second surface of the substrate; and
   a first insulation layer disposed on the first surface of the substrate and having a first inclined surface toward the first electrical contact, forming a first cavity;
   wherein the second electronic component overlaps with the first cavity and the first electronic component in a direction substantially perpendicular to the first surface of the substrate.

4. A method of manufacturing a semiconductor device package, comprising:
   providing a substrate, an electrical contact disposed on the substrate and an encapsulant disposed on the substrate and encapsulating the electrical contact;
   removing a portion of the encapsulant and a portion of the electrical contact so that the electrical contact is exposed from the encapsulant; and
   forming a cavity on a first surface of the encapsulant so that the electrical contact is accommodated by the cavity, wherein the electrical contact comprises a side surface facing and spaced apart from an inner side wall of the cavity.

5. The semiconductor device package of claim 2, further comprising a first electronic component disposed under the first surface of the substrate, wherein the conductive layer and the first electronic component are overlapping in a second direction substantially parallel to the first surface of the substrate.

6. The semiconductor device package of claim 5, further comprising a second insulation layer disposed over a second surface of the substrate, which is opposite to the first surface of the substrate, and wherein a lateral side surface of the second insulation layer substantially aligns with the lateral side surface of the substrate, and wherein the conductive layer is disposed on an upper surface and the lateral side surface of the second insulation layer, and wherein the conductive layer and the first electronic component are overlapping in the first direction substantially perpendicular to the first surface of the substrate.

7. The semiconductor device package of claim 1, further comprising a second electronic component disposed over a second surface of the substrate, which is opposite to the first surface of the substrate, and a second insulation layer covering the second electronic component, wherein, in a cross-sectional view, the second electronic component is adjacent to a lateral side surface of the substrate, and wherein a vertical distance between the second electronic and an upper surface of the second insulation layer is smaller than a horizontal distance between the second electronic component and a lateral side surface of the second insulation layer.

8. The semiconductor device package of claim 7, wherein the second electronic component and the first electrical contact are overlapping in the first direction, and wherein the vertical distance between the second electronic component and the upper surface of the second insulation layer is smaller than a width of the cavity in the cross-sectional view, and wherein the width of the cavity is located to be substantially level with and substantially parallel to the first surface of the first insulation layer.

9. The semiconductor device package of claim 1, wherein the first insulation layer comprises a filler exposed from the first surface of the first insulation layer.

10. The semiconductor device package of claim 9, wherein the first surface of the first insulation layer and a lower surface of the filler are substantially level with each other.

11. The semiconductor device package of claim 9, further comprising a first electronic component connected to the substrate through the first surface of the substrate, wherein a lower surface of the first electronic component is exposed from the first surface of the first insulation layer, and wherein a lower surface of the filler and the lower surface of the first electronic component are substantially level with each other.

12. The semiconductor device package of claim 1, further comprising:
a second insulation layer disposed on a second surface of the substrate, which is opposite to the first surface;
an electronic component encapsulated by the second insulation layer and closest to a left side surface of the second insulation layer in a cross-sectional view; and
a second electrical contact disposed under the first surface of the substrate and closest to a left side surface of the first insulation layer in the cross-sectional view;
wherein, in the cross-sectional view, a horizontal distance between the electronic component and the left side surface of the second insulation layer is smaller than a horizontal distance between a left side of the second electrical contact and the left side surface of the first insulation layer.

13. The semiconductor device package of claim 3, wherein a curvature of a first portion of the first electrical contact, which is in contact with the first insulation layer, is substantially identical to a curvature of a second portion of the first electrical contact, which is spaced apart from the first insulation layer.

14. The semiconductor device package of claim 3, further comprising a second electrical contact disposed under the first surface of the substrate, wherein the first insulation layer has a second inclined surface toward the second electrical contact, forming a second cavity, and wherein the second electronic component vertically overlaps a first gap between the first electrical contact and the first inclined surface and a second gap between second electrical contact and a second inclined surface.

15. The semiconductor device package of claim 3, further comprising a second electrical contact disposed under the first surface of the substrate, wherein the first insulation layer has a second inclined surface toward the second electrical contact, forming a second cavity, and wherein the second electronic component and the second inclined surface are vertically overlapping, the second electronic component and the second electrical contact are vertically non-overlapping.

16. The semiconductor device package of claim 3, further comprising a second electrical contact disposed over the first surface of the substrate, wherein the first insulation layer has a second inclined surface toward the second electrical contact, forming a second cavity, and wherein the second electronic component and the first inclined surface are vertically overlapping, and wherein the second electronic component and the second inclined surface are vertically overlapping.

17. The semiconductor device package of claim 3, further comprising a second insulation layer disposed over the second surface of the substrate, wherein the second insulation layer has a plurality of portions, which are located between the second electronic component and the second surface of the substrate and separated from each other, and wherein the first insulation layer has a plurality of portions, which are located between the first electronic component and the first surface of the substrate and separated from each other, and wherein a pitch between two adjacent portions of the second insulation layer is greater than a pitch between two adjacent portions of the first insulation layer.

18. The method of claim 4, wherein the step of removing a portion of the encapsulant and a portion of the electrical contact further comprises: removing a portion of an electric component disposed on the substrate.

19. The method of claim 18, further comprising: exposing a lower surface of the electronic component by the step of removing the portion of the encapsulant.

20. The method of claim 4, wherein the step of forming the cavity on a first surface of the encapsulant further comprises: exposing a filler of the encapsulant from the inner side wall of the cavity.

\* \* \* \* \*